(12) United States Patent
Sawaguchi et al.

(10) Patent No.: US 11,825,632 B2
(45) Date of Patent: Nov. 21, 2023

(54) THERMALLY CONDUCTIVE INSULATING SHEET, AND COMPOSITE MEMBER

(71) Applicants: TOYO INK SC HOLDINGS CO., LTD., Tokyo (JP); TOYOCHEM CO., LTD., Tokyo (JP)

(72) Inventors: Toshiichi Sawaguchi, Tokyo (JP); Naohiro Tanaka, Tokyo (JP); Kaori Sakaguchi, Tokyo (JP); Kenji Andou, Tokyo (JP); Hidenobu Kobayashi, Tokyo (JP)

(73) Assignees: TOYO INK SC HOLDINGS CO., LTD., Tokyo (JP); TOYOCHEM CO., LTD., Tokyo (JP)

( * ) Notice: Subject to any disclaimer, the term of this patent is extended or adjusted under 35 U.S.C. 154(b) by 320 days.

(21) Appl. No.: 16/646,147

(22) PCT Filed: Sep. 14, 2018

(86) PCT No.: PCT/JP2018/034198
§ 371 (c)(1),
(2) Date: Mar. 11, 2020

(87) PCT Pub. No.: WO2019/054486
PCT Pub. Date: Mar. 21, 2019

(65) Prior Publication Data
US 2020/0275581 A1    Aug. 27, 2020

(30) Foreign Application Priority Data

Sep. 15, 2017   (JP) ................................. 2017-178236

(51) Int. Cl.
*H05K 7/20* (2006.01)
*B32B 7/027* (2019.01)
(Continued)

(52) U.S. Cl.
CPC ............ *H05K 7/2039* (2013.01); *B32B 7/027* (2019.01); *B32B 7/06* (2013.01); *B32B 7/12* (2013.01);
(Continued)

(58) Field of Classification Search
CPC ............... Y10T 428/25; Y10T 428/251; Y10T 428/252; Y10T 428/256; Y10T 428/257;
(Continued)

(56) References Cited

U.S. PATENT DOCUMENTS

| 2014/0008566 A1 | 1/2014 | Kitagawa et al. |
| 2014/0079913 A1 | 3/2014 | Nishiyama et al. |

(Continued)

FOREIGN PATENT DOCUMENTS

| CN | 105601977 | 5/2016 |
| JP | 2012212727 | 11/2012 |

(Continued)

OTHER PUBLICATIONS

Machine translation (Esapcenet) of JP 2014-067923 A. Translated Aug. 24, 2023. (Year: 2023).*

(Continued)

*Primary Examiner* — Maria V Ewald
*Assistant Examiner* — Ethan A. Utt
(74) *Attorney, Agent, or Firm* — JCIPRNET

(57) ABSTRACT

The present invention provides a thermally conductive insulating sheet having appropriate fluidity upon being heated and pressurized, and free from of the possibility of a material leaking to the outside beyond the original size of the sheet. The thermally conductive insulating sheet according to the present invention contains an uncured material and/or a semi-cured material of a binder resin (R) which is a thermosetting resin. In the present invention, a complex viscosity in a temperature range of 100-200° C. is 10,000-150,000

(Continued)

Pa·s, a ratio ($\alpha/\beta$) of the maximum value ($\alpha$) to the minimum value ($\beta$) of the complex viscosity in said temperature range is 1.0-4.0, and the flow value is 90-100%. Flow value(%)=W2/W1×100.

10 Claims, 3 Drawing Sheets

(51) Int. Cl.
- *H01L 23/36* (2006.01)
- *B32B 27/06* (2006.01)
- *B32B 7/06* (2019.01)
- *B32B 7/12* (2006.01)

(52) U.S. Cl.
CPC .............. *B32B 27/06* (2013.01); *H01L 23/36* (2013.01); *B32B 2264/10* (2013.01); *B32B 2307/302* (2013.01); *B32B 2307/542* (2013.01); *B32B 2457/00* (2013.01)

(58) Field of Classification Search
CPC .............. Y10T 428/258; Y10T 428/259; Y10T 428/28; Y10T 428/2809; Y10T 428/2813; Y10T 428/2852; Y10T 428/2878; Y10T 428/2887; Y10T 428/2891; Y10T 428/2896; Y10T 428/31551; Y10T 428/31598; Y10T 428/31605; Y10T 428/31725; Y10T 428/31855; Y10T 428/31935; B32B 5/00; B32B 5/16; B32B 5/22; B32B 5/30; B32B 7/00; B32B 7/04; B32B 7/12; B32B 27/00; B32B 27/04; B32B 27/06; B32B 27/08; B32B 27/14; B32B 27/18; B32B 27/20; B32B 27/30; B32B 27/308; B32B 27/34; B32B 27/40; B32B 2260/00; B32B 2260/02; B32B 2260/025; B32B 2260/04; B32B 2260/046; B32B 2264/00; B32B 2264/10; B32B 2264/102; B32B 2264/1021; B32B 2264/1023; B32B 2264/1026; B32B 2264/104; B32B 2264/107; B32B 2264/12; B32B 2264/20; B32B 2264/201; B32B 2264/202; B32B 2264/30; B32B 2264/303; B32B 2305/30; B32B 2307/20; B32B 2307/206; B32B 2307/30; B32B 2307/302; B32B 2457/00; B32B 2457/08; B32B 2457/14; H05K 1/00; H05K 1/02; H05K 1/0201; H05K 1/0203; H05K 1/0204; H05K 7/00; H05K 7/20; H05K 7/2039; H01L 23/00; H01L 23/34; H01L 23/36; H01L 23/373; H01L 23/3731; H01L 23/3737; C09J 7/00; C09J 7/10; C09J 7/30; C09J 7/35; C09J 7/38; C09J 7/381; C09J 7/385; C09J 9/00; C09J 133/00; C09J 133/04; C09J 133/06; C09J 133/08; C09J 133/10; C09J 133/12; C09J 133/18; C09J 133/20; C09J 133/22; C09J 133/24; C09J 133/26; C09J 175/00; C09J 175/04; C09J 175/06; C09J 175/08; C09J 175/10; C09J 175/12; C09J 175/14; C09J 175/16; C09J 177/00; C09J 177/02; C09J 177/04; C09J 177/06; C09J 177/08; C09J 177/10; C09J 177/12; C09J 2203/318; C09J 2203/322; C09J 2203/326; C09J 2301/30; C09J 2301/302; C09J 2301/304; C09J 2301/312; C09J 2301/314; C09J 2301/40; C09J 2301/408; C09J 2301/412; C08L 33/00; C08L 33/04; C08L 33/06; C08L 33/08; C08L 33/10; C08L 33/12; C08L 33/18; C08L 33/20; C08L 33/22; C08L 33/24; C08L 33/26; C08L 75/00; C08L 75/04; C08L 75/06; C08L 75/08; C08L 75/10; C08L 75/12; C08L 75/14; C08L 75/16; C08L 77/00; C08L 77/02; C08L 77/04; C08L 77/06; C08L 77/08; C08L 77/10; C08L 77/12; C08L 2201/04; C08L 2203/20; C08L 2203/204; C08L 2203/206; C08K 3/00; C08K 3/01; C08K 3/013; C08K 3/10; C08K 3/14; C08K 3/18; C08K 3/20; C08K 3/22; C08K 3/28; C08K 3/34; C08K 3/36; C08K 3/38; C08K 2003/2206; C08K 2003/2217; C08K 2003/2224; C08K 2003/2227; C08K 2003/282; C08K 2003/382; C08K 2003/385; C08K 7/00; C08K 7/16; C08K 7/18
USPC ....... 428/323, 324, 325, 328, 329, 330, 331, 428/343, 345, 346, 355 R, 355 EN, 428/355 CN, 355 AC, 355 N, 423.1, 428/425.5, 425.8, 474.4, 500, 522; 174/68.1, 250, 252, 256, 257, 258, 259, 174/260, 100 R, 118, 110 A, 110 SR, 174/110 N, 137 R, 209, 137 B; 524/80, 524/401, 404, 424, 425, 428, 430, 433, 524/436, 437, 442, 543, 565, 566, 589, 524/700, 701, 730, 779, 786, 787, 788, 524/789, 791, 796, 847, 849, 871, 872, 524/873, 874, 878, 879
See application file for complete search history.

(56) References Cited

U.S. PATENT DOCUMENTS

| | | | |
|---|---|---|---|
| 2014/0367883 A1* | 12/2014 | Hatakeyama | C09K 5/14 264/175 |
| 2015/0110985 A1* | 4/2015 | Sakaguchi | C09K 5/14 524/390 |
| 2019/0077133 A1 | 3/2019 | Sawaguchi et al. | |

FOREIGN PATENT DOCUMENTS

| | | | |
|---|---|---|---|
| JP | 2014067923 A | * | 4/2014 |
| JP | 2015103578 | | 6/2015 |
| JP | 2016079304 | | 5/2016 |
| JP | 6135817 | | 5/2017 |
| WO | 2012102212 | | 8/2012 |
| WO | 2012132691 | | 10/2012 |
| WO | 2013065758 | | 5/2013 |

OTHER PUBLICATIONS

"International Search Report (Form PCT/ISA/210) of PCT/JP2018/034198," dated Nov. 27, 2018, with English translation thereof, pp. 1-4.

"Office Action of Taiwan Counterpart Application" with English translation thereof, dated Sep. 14, 2021, p. 1-p. 10.

* cited by examiner

THERMALLY CONDUCTIVE INSULATING SHEET, AND COMPOSITE MEMBER

CROSS-REFERENCE TO RELATED APPLICATION

This application is a 371 application of the International PCT application serial no. PCT/JP2018/034198, filed on Sep. 14, 2018, which claims the priority benefit of Japan Patent Application No. 2017-178236, filed on Sep. 15, 2017. The entirety of each of the above-mentioned patent applications is hereby incorporated by reference herein and made a part of this specification.

The present invention relates to a thermally conductive insulating sheet and a composite member using the same.

BACKGROUND ART

In order to promote thermal conduction from a heat generating member that can generate heat in various electronic components (for example, a power semiconductor element and a power card including the same) to a heat dissipation member such as a heat sink and promote heat dissipation, it is preferable to dispose a thermally conductive insulating adhesive film between a heat dissipation base substrate of the heat dissipation member and the heat generating member. The thermally conductive insulating adhesive film preferably contains a thermally conductive insulating filler and a binder resin so that high thermal conductivity can be exhibited.

For example, the thermally conductive insulating adhesive film can be simply formed by disposing a thermally conductive insulating sheet containing a thermally conductive filler and an uncured and/or semi-cured binder resin material which is a thermosetting resin between a heat dissipation member and a heat generating member and curing it by heating and pressing.

The thermally conductive insulating sheet preferably has high thermal conductivity and excellent insulating properties. It is preferable that the thermally conductive insulating sheet have a flexibility at which it can favorably conform to surface irregularities of the heat generating member and the heat dissipation member and favorably adhere the heat generating member to the heat dissipation member.

In Patent Literature 1, the inventors provide a thermally conductive insulating sheet in which a plurality of layers (A) containing a relatively large amount of thermally conductive spherical filler excluding boron nitride and one or more layers (B) containing a relatively large amount of boron nitride filler are alternately laminated so that the layer (A) is the outermost layer as a thermally conductive insulating sheet having both high thermal conductivity and excellent insulating properties (Claim 1).

The thermally conductive insulating sheet can be produced by alternately laminating a plurality of sheets (A') containing a relatively large amount of thermally conductive spherical filler excluding boron nitride and sheets of one or more layers (B') containing a relatively large amount of boron nitride filler so that a sheet (B') is not the outermost layer and performing pressurizing (Claim 5).

CITATION LIST

Patent Literatures

[Patent Literature 1]
 Japanese Patent No. 6135817
[Patent Literature 2]
 WO2012/102212
[Patent Literature 3]
 WO2013/065758
[Patent Literature 4]
 Japanese Patent Laid-Open No. 2016-79304
[Patent Literature 5]
 WO2012/132691
[Patent Literature 6]
 Japanese Patent Laid-Open No. 2012-212727
[Patent Literature 7]
 Japanese Patent Laid-Open No. 2015-103578

SUMMARY OF INVENTION

Technical Problem

It is preferable that a thermally conductive insulating sheet flow to some extent during heating and pressing so that it can favorably conform to surface irregularities of the heat generating member and the heat dissipation member, it can favorably adhere the heat generating member to the heat dissipation member, and the number of voids can be reduced. However, if a material excessively flows during heating and pressing and leaks (flows) to the outside beyond the original size of the sheet, there is a risk of a desired thermal conduction performance not being obtained, and the appearance also not being preferable.

Examples of the past of the present invention include Patent Literatures 2 to 8.

Patent Literature 2 discloses a resin composition sheet containing a thermosetting resin, a phenolic resin, and an insulating inorganic filler and having a minimum melt viscosity of 10 to 1000 Pa·s at 20 to 200° C. (Claims 1 and 2).

Patent Literature 2 describes that, since the minimum melt viscosity of the resin composition sheet affects the fluidity of the resin composition in a pressing and heating process from a B stage to a C stage, if the minimum melt viscosity at 20 to 200° C. is adjusted, it is possible to constrain outflow of the resin composition sheet from the end (paragraph 0136). In addition, it is described that, when the minimum melt viscosity at 20 to 200° C. is within the above range, excellent fluidity is exhibited during heating and it is possible to conform with respect to an adherend having an irregular structure (paragraph 0138). However, in Patent Literature 2, there is no description or suggestion regarding a specific flow level.

Patent Literature 3 discloses a resin sheet containing a first filler containing α-alumina, a second filler containing a nitride filler, and a thermosetting resin (Claims 1, 4, and 15).

The amount of flow of the semi-cured resin sheet may be, for example, 130 to 210% (Claim 16). In addition, the viscosity of the semi-cured sheet (B stage sheet) may be, for example, $10^4$ to $10^5$ Pa·s at room temperature (25 to 30° C.) and $10^2$ to $10^3$ Pa·s at 100° C. (paragraph 0210).

In Patent Literature 3, a sample obtained by punching a B stage sheet with a thickness of 200 μm into a 10 mm square is pressed under conditions of atmospheric pressure, a temperature of 180° C. and a pressing pressure of 15 MPa for 1 minute, and the amount of flow is calculated as a rate of change in area of the B stage sheet from before to after pressing (paragraph 0218).

The amount of flow described in Patent Literature 3 is large, which is not practically preferable.

Patent Literature 4 discloses a resin sheet containing a resin and an inorganic filler and having a melt viscosity of $1.0 \times 10^5$ to $1.0 \times 10^8$ Pa·s at 100° C. (Claim 1)

Patent Literature 4 describes that, when the content of inorganic filler is 40 to 80 volume %, a certain viscosity is imparted to the resin, and the resin can be prevented from flowing out during adhering (paragraph 0056). However, in Patent Literature 4, there is no description or suggestion regarding a specific flow level.

Patent Literature 5 discloses a multilayer resin sheet having a resin composition layer containing a thermosetting resin and a filler and an adhesive layer disposed on at least one surface of the resin composition layer (Claim 1).

The viscosity of the semi-cured sheet (B stage sheet) may be, for example, $10^4$ to $10^7$ Pa·s at room temperature (25 degrees) and $10^2$ to $10^6$ Pa·s at 100° C. (paragraph 0121).

Patent Literature 5 describes that, in the multilayer resin sheet, before bonding to an adherend, at least some of a filler with a large particle diameter in the resin composition layer is incorporated into the adhesive layer, and thus it is possible to constrain a resin flow during adhering (paragraph 0155).

However, in Patent Literature 5, there is no description or suggestion regarding a specific flow level.

Patent Literature 6 discloses a method of producing a thermally conductive sheet including a sheet forming process in which a resin composition containing a resin and thermally conductive inorganic particles is thermally pressed and is changed from a molten state to a semi-solid state, and additionally the viscosity is then increased to form a sheet (Claim 1).

The sheet forming process preferably includes a melting process in which the resin composition is thermally pressed under heating and pressing conditions in which the resin is thermally melted and a holding process in which the temperature is lowered to a temperature at which the resin hardly flows, and a pressurized state is maintained until this temperature is reached after the melting process (Claim 2).

Preferably, in the melting process, thermal pressing is performed so that the viscosity of the resin becomes less than 5,000 mPa·s and in the holding process, the sheet is held until the viscosity of the resin becomes 5,000 mPa·s or more (Claim 3).

In Patent Literature 6, it is described that, according to the above method, a sheet that is thermally pressed so that the viscosity of the resin becomes less than 5,000 mPa·s in the melting process is held until the viscosity becomes 5,000 mPa·s or more in the holding process, and thus the orientation of thermally conductive inorganic particles can be improved and the number of voids in the sheet can be reduced (paragraph 0017).

However, in Patent Literature 6, there is no description or suggestion regarding a flow level.

Patent Literature 7 describes that, in a thermosetting die bond film containing thermally conductive particles having a thermal conductivity of 12 W/m·K or more, the melt viscosity at 130° C. may be, for example, in a range of 10 to 300 Pa·s (Claim 1, paragraph 0082).

Patent Literature 7 describes that, when the melt viscosity at 130° C. is in a range of 10 to 300 Pa·s, the shape of the film is maintained and the viscosity is relatively low, and thus it is possible to sufficiently conform to irregularities of the adherend and the occurrence of voids can be reduced (paragraph 0082).

However, in Patent Literature 7, there is no description or suggestion regarding a flow level.

The present invention has been made in view of the above circumstances, and an objective of the present invention is to provide a thermally conductive insulating sheet which is disposed between a heat generating member and a heat dissipation member, has appropriate fluidity at which it can favorably conform to surface irregularities of the heat generating member and the heat dissipation member during heating and pressing, and has no risk of a material leaking to the outside beyond the original size of the sheet.

Solution to Problem

A thermally conductive insulating sheet of the present invention is a thermally conductive insulating sheet which includes an uncured and/or semi-cured binder resin (R) material which is a thermosetting resin, wherein a complex viscosity in a temperature range of 100 to 200° C. is 10,000 to 150,000 Pa·s, a ratio ($\alpha/\beta$) of a maximum value ($\alpha$) to a minimum value ($\beta$) of the complex viscosity in the temperature range is 1.0 to 4.0, and a flow value defined by the following Formula (1) is 90 to 100%:

$$\text{Flow value (\%)} = W2/W1 \times 100\% \quad (1)$$

(in Formula (1), reference numerals indicate the following parameters

W1 is a mass of a 50 mm-square thermally conductive insulating sheet, and

W2 is a mass of a 50 mm-square heated and pressed product of a thermally conductive insulating sheet obtained by heating and pressurizing the 50 mm-square thermally conductive insulating sheet under conditions of 150° C. and 1 MPa for 60 minutes).

A composite member of the present invention is obtained when a heat dissipation base substrate is adhered to at least one surface of a heat generating member including a heat generating part that is able to generate heat via a thermally conductive insulating film containing a cured material of a binder resin (R), which is formed of a heated and pressed product of the thermally conductive insulating sheet according to the above invention.

Advantageous Effects of Invention

According to the present invention, it is possible to provide a thermally conductive insulating sheet which is disposed between a heat generating member and a heat dissipation member, has appropriate fluidity at which it can favorably conform to surface irregularities of the heat generating member and the heat dissipation member during heating and pressing, and has no risk of a material leaking to the outside beyond the original size of the sheet.

DESCRIPTION OF EMBODIMENTS

[Thermally Conductive Insulating Sheet]

Figure 1:
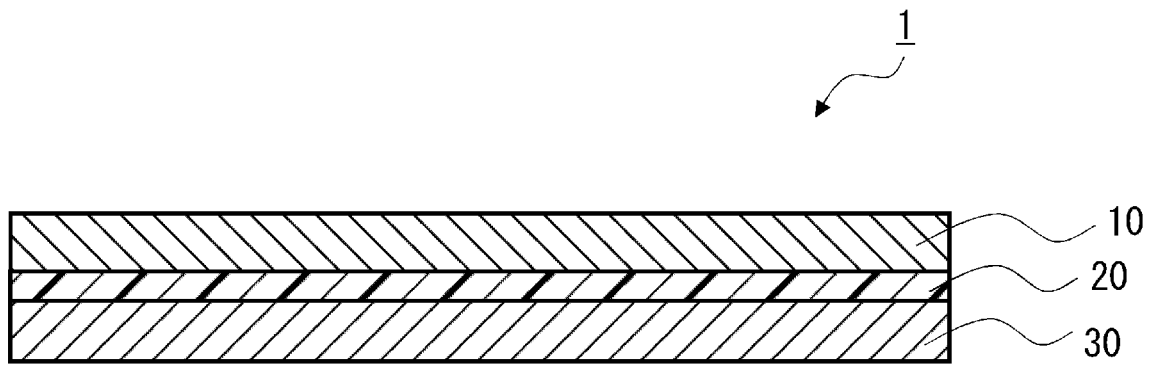
FIG. 1 is a schematic cross-sectional view of a composite member according to a first embodiment of the present invention.

A thermally conductive insulating sheet of the present invention contains an uncured and/or semi-cured binder resin (R) material which is a thermosetting resin.

The thermally conductive insulating sheet of the present invention preferably contains a thermally conductive insulating filler (F) and an uncured or semi-cured binder resin (R) material which is a thermosetting resin because in this case high thermal conductivity can be exhibited.

In this specification, "uncured material" is a material in which a raw material thermosetting resin is not cured at all, and "semi-cured material" is a material in which a raw material thermosetting resin is partially cured but is not yet completely cured (a so-called B stage resin).

The thermally conductive insulating sheet of the present invention has a complex viscosity of 10,000 to 150,000 Pa·s in a temperature range of 100 to 200° C., a ratio ($\alpha/\beta$) of the maximum value ($\alpha$) to the minimum value ($\beta$) of the complex viscosity in this temperature range is 1.0 to 4.0, and a flow value defined by the following Formula (1) is 90 to 100%.

$$\text{Flow value (\%)} = W2/W1 \times 100\% \quad (1)$$

(in Formula (1), reference numerals indicate the following parameters

W1 is a mass of a 50 mm-square thermally conductive insulating sheet, and

W2 is a mass of a 50 mm-square heated and pressed product of a thermally conductive insulating sheet obtained by heating and pressurizing the 50 mm-square thermally conductive insulating sheet under conditions of 150° C. and 1 MPa for 60 minutes).

The thermally conductive insulating sheet of the present invention is disposed between a heat generating member that can generate heat in various electronic components (for example, a power semiconductor element and a power card including the same) and a heat dissipation base substrate of a heat dissipation member such as a heat sink, and can be used by being cured by heating and pressing.

In this specification, the heated and pressed product (cured product) of the thermally conductive insulating sheet is referred to as a "thermally conductive insulating film," and a structure composed of heat generating member/thermally conductive insulating film/heat dissipation base substrate of a heat dissipation member is referred to as a "composite member."

In the thermally conductive insulating sheet of the present invention, the complex viscosity in a temperature range of 100 to 200° C. is 10,000 to 150,000 Pa·s, and a ratio ($\alpha/\beta$) of the maximum value ($\alpha$) to the minimum value ($\beta$) of the complex viscosity in this temperature range is 1.0 to 4.0.

When the maximum value ($\alpha$) of the complex viscosity in the above temperature range is 150,000 Pa·s or less, the sheet has appropriate fluidity during heating and pressing, and can favorably conform to surface irregularities of the heat generating member and the heat dissipation member and favorably adhere the heat generating member to the heat dissipation member. In addition, when the sheet has appropriate fluidity during heating and pressing, the number of voids can be reduced and the porosity can be reduced, and accordingly, a thermally conductive insulating film having excellent insulating properties can be formed.

When the minimum value ($\beta$) of the complex viscosity in the above temperature range is 10,000 Pa·s or more, it is possible to prevent a material from excessively flowing during heating and pressing and from leaking (flowing) to the outside beyond the original size of the sheet.

When $\alpha/\beta$ is 1.0 to 4.0, a difference between $\alpha$ and $\beta$ is not large, there is no sudden change in viscosity during heating and pressing, and the fluidity of the material is suitable.

In the thermally conductive insulating sheet of the present invention, preferably, the complex viscosity in this temperature range of 100 to 200° C. is 27,000 to 100,000 Pa·s, and a ratio ($\alpha/\beta$) of the maximum value ($\alpha$) to the minimum value ($\beta$) of the complex viscosity in this temperature range is 1.0 to 2.5.

Since the thermally conductive insulating sheet of the present invention has the above viscosity characteristics and has appropriate fluidity during heating and pressing, it does not excessively flow during heating and pressing. Therefore, the thermally conductive insulating sheet of the present invention has a flow value of 90 to 100%, and there is no risk of a material excessively flowing during heating and pressing and leaking (flowing) to the outside beyond the original size of the sheet. Therefore, when a composite member is produced using the thermally conductive insulating sheet of the present invention, there is no risk of desired thermal conduction performance and desired adhesion performance not being obtained due to material outflow, and there is no risk of the appearance of the composite member deteriorating due to material outflow. The flow value is preferably 95 to 100%, and more preferably 97 to 100%.

The complex viscosity of the thermally conductive insulating sheet in a temperature range of 100 to 200° C., a ratio ($\alpha/\beta$) of the maximum value ($\alpha$) to the minimum value ($\beta$) of the complex viscosity in this temperature range, and the flow value can be adjusted through the composition of the thermally conductive insulating sheet such as the type of the binder resin (R), the molecular weight of the binder resin (R), the proportion of the curing agent, and the type and amount of the thermally conductive insulating filler (F).

In this specification, unless otherwise specified, various parameters are obtained by the methods described in the following section [Examples].

(Thermally Conductive Insulating Filler (F))

The thermally conductive insulating filler (F) is not particularly limited as long as it has thermal conductivity, and includes, for example, a metal oxide such as aluminum oxide, calcium oxide, and magnesium oxide; a metal nitride such as aluminum nitride and boron nitride; a metal hydroxide such as aluminum hydroxide and magnesium hydroxide; a metal carbonate such as calcium carbonate and magnesium carbonate; a metal silicate such as calcium silicate; a hydrous metal compound; and crystalline silica, amorphous silica, silicon carbide, and combinations thereof. These can be used alone or two or more thereof can be used in combination. Among these, alumina, aluminum nitride, boron nitride, and the like are preferable.

The form of the thermally conductive insulating filler (F) is not particularly limited, and examples thereof include primary particles, granules obtained by granulating primary particles, aggregates thereof, and combinations thereof.

The thermally conductive insulating filler (F) preferably includes a boron nitride filler having high thermal conductivity. Generally, since a boron nitride filler has poor wettability and irregular shapes, when only a boron nitride filler is used as the thermally conductive insulating filler (F), voids tend to be formed inside. In consideration of high thermal conductivity and low porosity, the thermally conductive insulating filler (F) preferably includes a thermally conductive spherical filler (F1) excluding boron nitride and a boron nitride filler (F2).

In consideration of high thermal conductivity and low porosity, a preferable form includes a thermally conductive insulating sheet (S) which has a plurality of layers (A) that contain a thermally conductive spherical filler (F1) and an uncured or semi-cured binder resin (R) material and may contain a boron nitride filler (F2), and one or more layers (B) that contain a boron nitride filler (F2) and an uncured or semi-cured binder resin (R) material and may contain a thermally conductive spherical filler (F1), and has a structure in which the plurality of layers (A) and the one or more layers (B) are alternately laminated so that the layer (B) does not become the outermost layer.

In this specification, the outmost layer among the plurality of layers (A) is referred to as an outermost layer ($A_{out}$).

The layer (A) is a layer containing a relatively large amount of the thermally conductive spherical filler (F1), and the layer (B) is a layer containing a relatively large amount of the boron nitride filler (F2). The content of the binder resin (R) in at least the outermost layer ($A_{out}$) among the plurality of layers (A) may be, for example, larger than the content of the binder resin (R) in the layer (B).

The thermally conductive insulating sheet (S) may be, for example, an uncured or semi-cured laminated pressed sheet in which a plurality of sheets (A') that contain a thermally conductive spherical filler (F1) and an uncured binder resin (R), and may contain a boron nitride filler (F2), and sheets of one or more layers (B') that contain a boron nitride filler (F2) and an uncured binder resin (R) and may contain a thermally conductive spherical filler (F1) are alternately laminated and pressed so that the sheet (B') does not become the outermost layer.

Sheets (A') and (B') each can contain a flame retardant, a filling agent, and other various additives as necessary. Examples of flame retardants include aluminum hydroxide, magnesium hydroxide, and phosphate compounds. Examples of other additives include a coupling agent for improving a substrate adhesion, an ion scavenger and an antioxidant for improving reliability during moisture absorption and at high temperatures, and a leveling agent.

In the thermally conductive insulating sheet (S), high thermal conductivity can be secured with the sheet (B') containing a relatively large amount of the boron nitride filler (F2) having high thermal conductivity, but voids tend to occur with the sheet (B') alone. When the sheet (A') contains a relatively large amount of the thermally conductive spherical filler (F1) that generates hardly any voids, and preferably contains a relatively larger amount of the binder resin (R) than that of the sheet (B'), after pressing, preferably, after heating and pressing at a temperature at which the binder resin (R) is not completely cured, voids in the sheet (B') are effectively filled, the total amount of voids in the thermally conductive insulating sheet (S) is reduced, and the overall porosity of the thermally conductive insulating sheet (S) can be reduced. Specifically, the overall porosity of the thermally conductive insulating sheet (S) is set to preferably 0.4 or less, and more preferably 0.3 or less.

In the sheet (A') containing a relatively large amount of the thermally conductive spherical filler (F1), since the contained filler is spherical, it is assumed that the sheet (A') is easily deformed by pressing, and preferably, heating and pressing even in a solvent-free state. As a result, it is assumed that the thermally conductive spherical filler (F1) positioned in the vicinity of the laminate interface with the sheet (B') and the binder resin (R), which are contained in the sheet (A'), and a part of the boron nitride filler (F2) that may be optionally contained, fills voids in the sheet (B') having many voids due to pressing and preferably, heating and pressing, and the overall porosity of the thermally conductive insulating sheet (S) can be reduced.

In the thermally conductive insulating sheet (S), when the layer (A) which contains a relatively large amount of the thermally conductive spherical filler (F1) and preferably contains a relatively large amount of the binder resin (R) and is relatively easily deformed is positioned as the outermost layer, it is possible to improve conformability to surface irregularities of the heat generating member and the heat dissipation member and the adhesion between the heat generating member and the heat dissipation member.

In a thermally conductive insulating film which is disposed between a heat generating member and a heat dissipation member, and which is produced by performing heating, pressing and curing at a temperature at which the binder resin (R) is completely cured, a total amount of voids can be effectively reduced by pressing, and the overall porosity can be effectively reduced. Specifically, the overall porosity of the thermally conductive insulating film is set to preferably 0.3 or less, and more preferably 0.2 or less.

Here, by pressing, preferably, by heating and pressing, a certain amount of the thermally conductive spherical filler (F1) and the binder resin (R) which are contained in the sheet (A') and the boron nitride filler (F2) that may be contained are transferred to the sheet (B'), but there is no method for identifying whether the pores of the sheet (B') have been filled (or an unrealistic amount of time and effort is necessary for identification). In addition, the binder resin (R), the thermally conductive spherical filler (F1), and the boron nitride filler (F2) are nonvolatile components. In consideration of these points, it is assumed that an occupied volume ratio does not change between before and after the sheet (A') and the sheet (B') are pressed, preferably, heated and pressed. That is, for convenience, the amount of each component contained in the sheet (A') is set as an amount in the layer (A), and for convenience, the amount of each component contained in the sheet (B') is set as an amount in the layer (B).

The porosity can be obtained by the method described in the following [Examples].

<Thermally Conductive Spherical Filler (F1)>

In this specification "spherical" can be expressed by, for example, a "circularity." A "circularity" can be obtained by the formula: $\text{(circularity)} = 4\pi S/L^2$ when an arbitrary number of particles are selected from a picture obtained by imaging particles under a scanning electron microscope (SEM) or the like, and an area of the particles is set as S, and a circumference length is set as L.

In this specification, unless otherwise specified, "spherical particles" refer to particles having an average circularity of 0.9 to 1 when an average circularity of particles is measured using a flow-type particle image analyzing device FPIA-1000 (commercially available from Toa Medical Electronics Co., Ltd.). Preferably, the average circularity is 0.96 to 1.

The type of the thermally conductive spherical filler (F1) may be any type having thermal conductivity other than boron nitride, and examples thereof include a metal oxide such as alumina, calcium oxide, magnesium oxide, crystalline silica, and amorphous silica; a metal nitride such as aluminum nitride; a metal hydroxide such as aluminum hydroxide and magnesium hydroxide; a metal carbide such as silicon carbide; a metal carbonate such as calcium carbonate and magnesium carbonate; a metal silicate such as calcium silicate; a hydrous metal compound; and combinations thereof. These can be used alone or two or more thereof can be used in combination.

In consideration of sphericity, thermal conductivity, and insulating properties, the thermally conductive spherical filler (F1) may be, for example, selected from the group consisting of alumina and aluminum nitride.

The average particle diameter of the thermally conductive spherical filler (F1) is not particularly limited, and is preferably 5 to 100 μm, and more preferably 5 to 50 μm in consideration of thermal conductivity, dispersibility in a coating solution, and the like.

<Boron Nitride Filler (F2)>

The form of the boron nitride filler (F2) is not particularly limited, and may be powdery or granular. For example, scaly primary particles, granules obtained by granulating scaly primary particles, and aggregates thereof can be used. Since scaly boron nitride particles have anisotropic thermal conductivity, granules obtained by granulating scaly primary particles or aggregates thereof is suitably used. Since the number of voids can be reduced by pressing, an easily deformable aggregate that is easily deformed by pressing is preferably used.

Unless otherwise specified, "easily deformable aggregate" in this specification refers to an aggregate of boron nitride having an average particle diameter of 2 to 100 μm and an average compressive force of 5 mN or less required for a compression deformation ratio of 10%, which is obtained by granulating boron nitride particles having an average primary particle diameter of 0.1 to 15 μm.

In this specification, "primary particles" refers to the smallest particles that can exist alone, and "average primary particle diameter" refers to a long diameter of primary particle diameters observed under a scanning electron microscope (SEM) or the like. The "long diameter of primary particle diameters" refers to the largest diameter of primary particles for spherical particles, and refers to the largest diameter or the largest diagonal length for hexagonal plate-like or disc-like particles in a projected image of particles observed in the thickness direction. Here, the "average primary particle diameter" is calculated by measuring long diameters of 300 particles by the above method and averaging the long diameters of the number of particles.

The average compressive force required for a compression deformation ratio of 10% can be obtained by measuring a load for deforming particles, which are 10 particles that are randomly selected in a measurement area, by 10%, using a micro compression testing machine (MCT-210 commercially available from Shimadzu Corporation).

(Binder Resin)

In the thermally conductive insulating sheet of the present invention, as the binder resin, a binder resin (R) which is at least one type of thermosetting resin is used.

The thermosetting binder resin (R) is not particularly limited, and examples thereof include a polyurethane resin, a polyester resin, a polyester urethane resin, an alkyd resin, a butyral resin, an acetal resin, a polyamide resin, an acrylic resin, a styrene-acrylic resin, a styrene resin, nitrocellulose, benzyl cellulose, cellulose(tri)acetate, casein, shellac, gilsonite, a styrene-maleic anhydride resin, a polybutadiene resin, a polyvinyl chloride resin, a polyvinylidene chloride resin, a polyvinylidene fluoride resin, a polyvinyl acetate resin, an ethylene vinyl acetate resin, a vinyl chloride/vinyl acetate copolymer resin, a vinyl chloride/vinyl acetate/maleic acid copolymer resin, a fluorine resin, a silicon resin, an epoxy resin, a phenoxy resin, a phenolic resin, a maleic acid resin, a urea resin, a melamine resin, a benzoguanamine resin, a ketone resin, a petroleum resin, rosin, a rosin ester, polyvinyl alcohol, polyvinyl pyrrolidone, polyacrylamide, hydroxyethyl cellulose, hydroxypropyl cellulose, methyl cellulose, ethyl cellulose, hydroxyethyl methylcellulose, hydroxypropyl methylcellulose, carboxymethyl cellulose, carboxymethyl ethyl cellulose, carboxymethyl nitrocellulose, an ethylene/vinyl alcohol resin, a polyolefin resin, a chlorinated polyolefin resin, a modified chlorinated polyolefin resin, polyurethane polyurea resin, and a chlorinated polyurethane resin.

Here, in this specification, when a plurality of types of thermosetting resins having functional groups that can react with each other are used, one with a larger amount may be referred to as a main agent and one with a smaller amount may be referred to as a curing agent.

Regarding the binder resin (R) which is a thermosetting resin, at least one selected from among a thermosetting polyurethane resin, a thermosetting acrylic resin, and a thermosetting polyamide resin is preferable because the viscosity (fluidity) during heating and pressing is suitable, the flexibility before curing and after curing is relatively high, the number of voids can be effectively reduced during heating and pressing, and suitable adhesion after heating and pressing is exhibited.

The weight average molecular weight (Mw) of the uncured binder resin (R) in the thermally conductive insulating sheet is not particularly limited, and is preferably 10,000 to 100,000, more preferably 15,000 to 90,000, still more preferably 17,000 to 85,000, particularly preferably 20,000 to 75,000, and most preferably 30,000 to 70,000.

When Mw is 10,000 or more, an excessive decrease in viscosity during heating and pressing is curbed, the outflow (flow) during heating and pressing is effectively curbed, and suitable adhesion after heating and pressing can be exhibited.

When Mw is 100,000 or less, since an excessive increase in viscosity during heating and pressing is curbed, the resin is prevented from becoming highly viscous before filling voids, the flexibility after curing becomes suitable, and suitable adhesion after heating and pressing can be exhibited.

In the present invention, as necessary, one or more other binder resins having no functional group that can react with the thermosetting resin during heating may be used in combination.

(Example of a Method of Producing a Thermally Conductive Insulating Sheet (S))

For example, the thermally conductive insulating sheet (S) can be produced by the following method.

A coating solution (A″) containing a thermally conductive spherical filler (F1), as necessary, a boron nitride filler (F2), an uncured binder resin (R), a solvent, and as necessary, other optional components is prepared. The coating solution (A") is applied to a releasable sheet, and the solvent is then volatilized and dried to prepare a sheet (A') with a releasable sheet.

Separately, in the same manner as above, a coating solution (B") containing a boron nitride filler (F2), as necessary, a thermally conductive spherical filler (F1), an uncured binder resin (R), a solvent, and as necessary, other optional components is prepared. The coating solution (B") is applied to a releasable sheet, and the solvent is then volatilized and dried to prepare a sheet (B') with a releasable sheet.

Thereafter, the side opposite to the releasable sheet of the sheet (B') with a releasable sheet and the side opposite to the releasable sheet of the sheet (A') with a releasable sheet are superimposed on each other. During superimposing, pressing may be performed.

Next, the releasable sheet covering the surface of the sheet (B') is peeled off and the side opposite to the releasable sheet of another sheet (A') with a releasable sheet is superimposed on the exposed surface of the sheet (B'), and thereby a laminate having a lamination structure of [releasable sheet/sheet (A')/sheet (B')/sheet (A')/releasable sheet] is obtained.

Then, when the laminate is pressed, sheet (A')/sheet (B')/sheet (A') are integrated, and a laminate in which both surfaces of the thermally conductive insulating sheet (S) having a lamination structure of "layer (A)/layer (B)/layer (A)] are covered with a releasable sheet can be obtained. By repeating the same operation, a thermally conductive insulating sheet (S) having a lamination structure of five or more layers can be formed. Here, pressing may be performed after the releasable sheets on both surfaces are peeled off.

The coating solution (A") for forming the sheet (A') and the coating solution (B") for forming the sheet (B') can be produced by stirring and mixing a thermally conductive spherical filler (F1) and/or a boron nitride filler (F2), an uncured binder resin (R), a solvent, and as necessary, other optional components.

A general stirring method can be used for stirring and mixing. A stirring and mixing machine is not particularly limited, and examples thereof include a kneading machine, Disper, Scandex, a paint conditioner, a sand mill, a grinding machine, a media-less dispersion machine, a three-roll mill, and a bead mill.

After stirring and mixing, in order to remove air bubbles from the coating solution (A") and the coating solution (B"), a deaeration process is preferably performed. A deaeration method is not particularly limited, and examples thereof include a vacuum deaeration and ultrasound deaeration.

Examples of releasable sheets include those obtained by performing a release treatment on a resin film such as a polyester film, a polyethylene film, a polypropylene film, and a polyimide film.

A method of applying the coating solution (A") or the coating solution (B") to a releasable sheet is not particularly limited, and examples thereof include knife coating, blade coating, comma coating, die coating, lip coating, roll coating, curtain coating, bar coating, gravure coating, flexo coating, dip coating, spray coating, screen coating, spin coating, a method using a dispenser, and inkjet printing.

The thickness of the sheet (A') and the sheet (B') and a coating amount per unit area are not particularly limited. When the thickness of the sheet (B') is relatively sufficiently thick with respect to the thickness of the sheet (A'), the number of voids can be effectively reduced by lamination. For example, in the case of the thermally conductive insulating sheet having a lamination structure of [layer (A)/layer (B)/layer (A)], the thickness of the sheet (A') for forming the layer (A) may be, for example, about half of the sheet (B') for forming the layer (B). However, the thicknesses of the sheets can be determined in consideration of heating and pressing conditions during lamination while observing the porosity and thermal conductivity of the finally obtained [layer (A)/layer (B)/layer (A)].

A pressurizing pressing method is not particularly limited, and a known press processing machine, a laminator, and the like can be used. A method in which the pressure of an atmosphere is reduced, a difference between it and atmospheric pressure is provided, and thus pressurizing pressing is performed may be used.

Since the number of voids can be effectively reduced, it is preferable to perform heating at a relatively low temperature at which the thermosetting resin is not completely cured during pressurization and compression.

[Composite Member]

A composite member of the present invention is obtained when a heat dissipation base substrate is adhered to at least one surface of a heat generating member including a heat generating part that can generate heat via a thermally conductive insulating film containing a cured material of a binder resin (R), which is formed of a heated and pressed product of the thermally conductive insulating sheet of the present invention.

(Heat Dissipation Base Substrate)

A heat dissipation base substrate is a base substrate of a heat dissipation member such as a heat sink.

Generally, a metal and/or ceramic are used as the material of the heat dissipation base substrate. Examples thereof include aluminum, copper, iron, tungsten, molybdenum, magnesium, a copper-tungsten alloy, a copper-molybdenum alloy, a copper-tungsten-molybdenum alloy, aluminum nitride, silicon carbide, and silicon nitride. These can be used alone or two or more thereof can be used in combination.

The surface roughness (Ra) of the surface in contact with the thermally conductive insulating adhesive film of the heat dissipation base substrate is preferably 0.1 to 2 μm, and more preferably 0.2 to 1.7 μm. When Ra is 0.1 μm or more, the adhesion between the heat dissipation base substrate and the thermally conductive insulating adhesive film is improved according to an anchor effect, and the durability is improved. When Ra is 2 μm or less, surface irregularities of the heat dissipation base substrate are reduced and insulating properties are improved.

In this specification, Ra is the arithmetic mean roughness, which can be measured according to JIS B0601 2001.

Known fins may be attached to the heat dissipation base substrate in order to increase heat dissipation efficiency. Examples of fins include a straight fin, a wavy fin, an offset fin, a pin fin, and a corrugated fin. These fins may be integrated with the heat dissipation base substrate.

(Heat Generating Member)

The heat generating member includes a heat generating part that can generate heat. Examples of heat generating members include various electronic components such as an integrated circuit, an IC chip, a semiconductor package such as a hybrid package, a semiconductor module such as a multi-module, a power transistor, a power semiconductor element, a power card including a power semiconductor element, a surface resistor, and a thermoelectric conversion module; building materials; and members of vehicles, aircrafts, ships, and the like.

For example, the composite member of the present invention is suitable when the heat generating member is a power semiconductor module such as a power card including a power semiconductor element.

In a power semiconductor module such as a power card, one or a plurality of power semiconductor elements are mounted on a substrate having at least a surface having conductivity (a surface on which a power semiconductor element is mounted) via a binding agent such as solder, and sealing may be, for example, performed using a sealing material such as an epoxy resin. In the power semiconductor module such as a power card, the power semiconductor element is a heat generating part. In the power semiconductor module such as a power card, a heat dissipation base substrate can be adhered to one surface or both surfaces via a thermally conductive insulating adhesive film. In this case, the member in contact with the thermally conductive insulating adhesive film of the heat generating member is a substrate having at least a surface having conductivity and/or a sealing material such as an epoxy resin.

Examples of substrates having at least a surface that is conductive include conductive substrates made of silver, copper, aluminum, nickel, tin, iron, lead, alloys thereof, and carbon. A circuit pattern may be formed into the conductive substrate. The substrate having at least a surface having conductivity may be a substrate in which a conductive film is formed on a non-conductive substrate made of a resin, ceramic, or the like.

The surface roughness (Ra) of the surface in contact with the thermally conductive insulating adhesive film of the heat generating member is preferably 0.1 to 2 µm, and more preferably 0.2 to 1.7 µm because the adhesion between the heat generating member and the thermally conductive insulating adhesive film is improved and the durability is improved. When Ra is 0.1 µm or more, the adhesion between the heat generating member and the thermally conductive insulating adhesive film is improved according to an anchor effect, and the durability is improved. When Ra is 2 µm or less, surface irregularities of the heat generating member are reduced and insulating properties are improved.

The thermally conductive insulating sheet of the present invention is disposed between the heat generating member and the heat dissipation base substrate, and heating and pressing are then performed at a temperature at which the binder resin (R) is completely cured, and thus a composite member of the present invention can be produced.

When the thermally conductive insulating sheet (S) is used, in a process of producing the thermally conductive insulating sheet (S), a pressurizing force when a composite member is produced can be set to be higher than a pressurizing force when the plurality of sheets (A') and the sheets of one or more layers (B') are alternately laminated.

(Embodiments of Composite Member)

The structures of composite members according to first to fifth embodiments of the present invention will be described with reference to the drawings. FIG. 1 to FIG. 5 are schematic cross-sectional views in which the same components are denoted with the same reference numerals.

In a composite member 1 according to the first embodiment shown in FIG. 1, a heat dissipation base substrate 30 is adhered to one surface of a heat generating member 10 such as a power semiconductor element via a thermally conductive insulating adhesive film 20.

Figure 2:
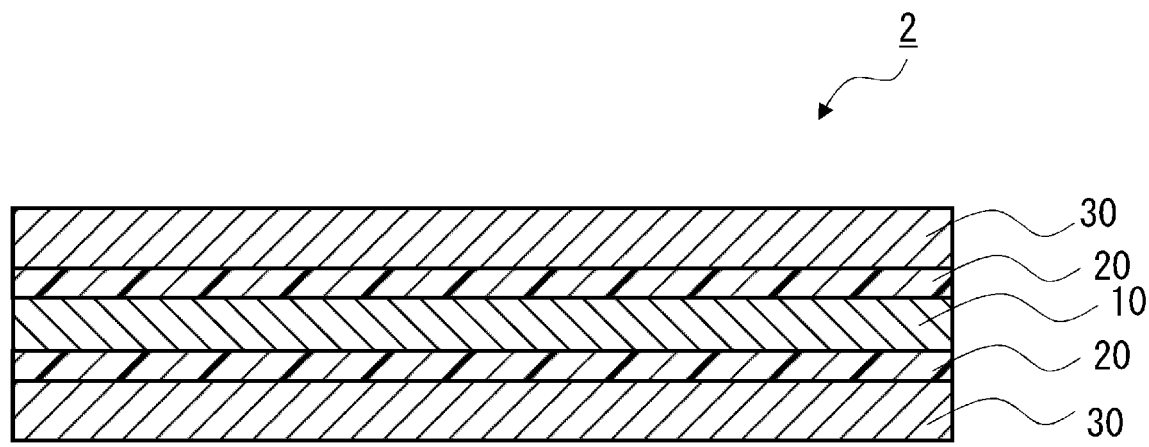
FIG. 2 is a schematic cross-sectional view of a composite member according to a second embodiment of the present invention.

In a composite member 2 according to the second embodiment shown in FIG. 2, the heat dissipation base substrate 30 is adhered to both surfaces of the heat generating member 10 such as a power semiconductor element via the thermally conductive insulating adhesive film 20.

In the composite members 1 and 2, almost the entire heat generating member 10 is a heat generating part.

Figure 3:
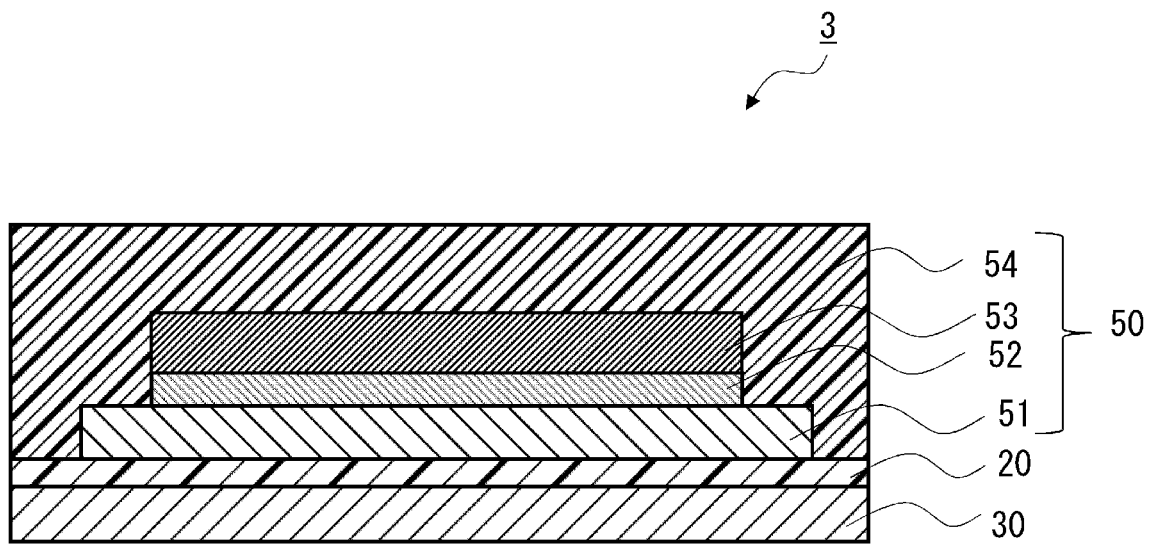
FIG. 3 is a schematic cross-sectional view of a composite member according to a third embodiment of the present invention.
Figure 4:
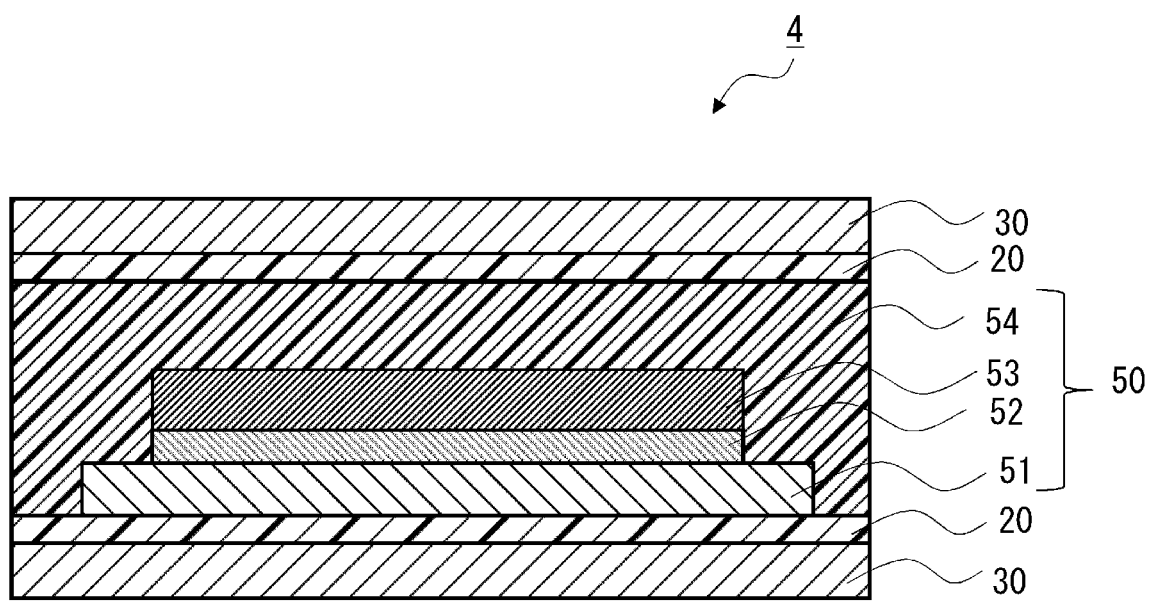
FIG. 4 is a schematic cross-sectional view of a composite member according to a fourth embodiment of the present invention.

In FIG. 3 and FIG. 4, the reference numeral 50 indicates a power semiconductor module (heat generating member) such as a power card including a power semiconductor element. In the power semiconductor module 50, a power semiconductor element 53 is mounted on a substrate 51 having at least a surface (surface on which a power semiconductor element is mounted) having conductivity such as a metal substrate via a solder layer 52, and sealing is performed using a sealing material 54 such as an epoxy resin. In the power semiconductor module 50, the power semiconductor element 53 is a heat generating part. The plurality of power semiconductor elements 53 may be mounted on the substrate 51.

In a composite member 3 according to the third embodiment shown in FIG. 3, the heat dissipation base substrate 30 is adhered to one surface (a surface on which no substrate 51 is mounted) of the power semiconductor module 50 via the thermally conductive insulating adhesive film 20. In the example shown in FIG. 3, the thermally conductive insulating adhesive film 20 and the heat dissipation base substrate 30 are disposed on the side of the substrate 51, but they may be disposed on the side of the sealing material 54.

In a composite member 4 according to the fourth embodiment shown in FIG. 4, the heat dissipation base substrate 30 is adhered to both surfaces of the power semiconductor module 50 via the thermally conductive insulating adhesive film 20.

Figure 5:
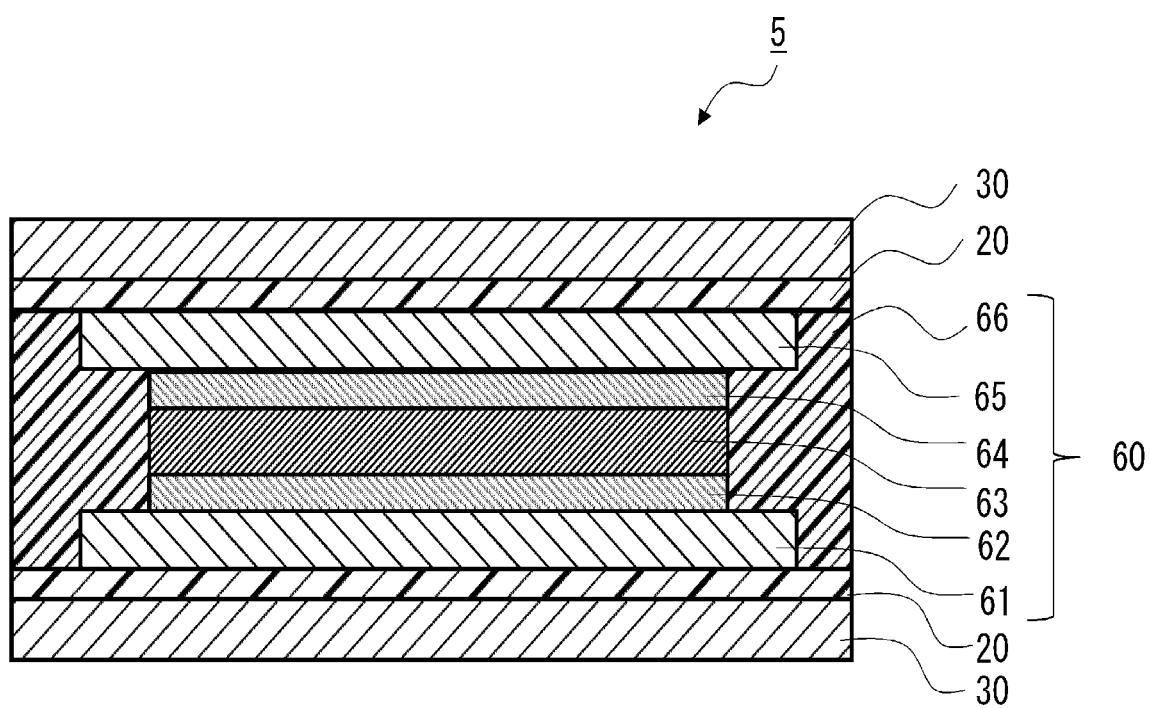
FIG. 5 is a schematic cross-sectional view of a composite member according to a fifth embodiment of the present invention.

In FIG. 5, the reference numeral 60 indicates a power semiconductor module (heat generating member) such as a power card including a power semiconductor element. In the power semiconductor module 60, a power semiconductor element 63 is mounted on a first substrate 61 having at least one surface (surface on the side of the power semiconductor element) having conductivity such as a metal substrate via a first solder layer 62, a second substrate 65 having at least one surface (surface on the side of the power semiconductor element) having conductivity such as a metal substrate is bonded thereon via a second solder layer 64, and sealing is performed using a sealing material 66 such as an epoxy resin. In the power semiconductor module 60, the power semiconductor element 63 is a heat generating part. The plurality of power semiconductor elements 63 may be mounted on the first substrate 61.

In a composite member 5 according to the fifth embodiment shown in FIG. 5, the heat dissipation base substrate 30 is adhered to both surfaces of the power semiconductor module 60 via the thermally conductive insulating adhesive film 20.

Designs of the composite members shown in FIG. 1 to FIG. 5 can be appropriately modified.

As described above, according to the present invention, it is possible to provide a thermally conductive insulating sheet which is disposed between a heat generating member and a heat dissipation member, has appropriate fluidity at which it can favorably conform to surface irregularities of the heat generating member and the heat dissipation member during heating and pressing, and has no risk of a material leaking to the outside beyond the original size of the sheet.

According to the present invention, it is also possible to provide a composite member including a thermally conductive insulating film which has a small porosity and favorably adheres a heat generating member to a heat dissipation member.

EXAMPLES

Examples and comparative examples according to the present invention will be described below. Here, in the section [Examples], "parts" and "%" represent "parts by mass," and "mass %," respectively, unless otherwise specified.

[Evaluation Items and Evaluation Methods for Fillers]

(Average Particle Diameter)

The average particle diameter of thermally conductive insulating fillers was measured using a particle size distribution meter Mastersizer 2000 (commercially available from Malvern Instruments). In the measurement, a dry unit was used, and an air pressure was 2.5 bar. A feed rate was optimized for the sample.

(Circularity)

The average circularity of the thermally conductive spherical filler was measured using a flow-type particle image analyzing device FPIA-1000 (commercially available from Toa Medical Electronics Co., Ltd.). About 5 mg of measurement particles were dispersed in 10 ml of toluene to prepare a dispersion solution, ultrasonic waves (20 kHz, 50 W) were applied to the dispersion solution for 5 minutes, and the concentration of the particles in the dispersion solution was 5,000 to 20,000 pieces/μl. The circularities of particle groups with equivalent circular diameter were measured using the dispersion solution and an average circularity was obtained.

(Average Compressive Force Required for Compression Deformation Ratio of 10%)

Regarding 10 particles that were randomly selected in a measurement area, a load for deforming the particles by 10% was measured using a micro compression testing machine (MCT-210 commercially available from Shimadzu Corporation). An average value thereof was set as an average compressive force required for a compression deformation ratio of 10%.

[Evaluation Items and Evaluation Methods for Resin Solution]

(Solid Content)

1 g of a resin solution was weighed out and put into a metal container with a thin lid, heating was performed in an oven at 200° C. for 20 minutes, the residual mass was then measured, and a solid content was determined according to the following formula.

Solid content (%)=(residual mass (g)/1(g))×100

(Weight Average Molecular Weight (Mw))

Mw was measured through gel permeation chromatography (GPC, HLC8220 GPC, commercially available from Tosoh Corporation). GPC is liquid chromatography through which substances that are dissolved in a solvent (THF; tetrahydrofuran) are separated and quantified according to a difference in molecular size.

A column in which two of "TOSOH TSKgel Super HZM-N" (commercially available from Tosoh Corporation) were connected in series was used, measurement was performed under conditions of a sample concentration of 0.1%, a flow rate of 0.34 ml/min, a pressure of 7.4 MPa, and a column temperature of 40° C., and Mw in terms of polystyrene standards was determined. Using built-in software of a device, a calibration curve was generated, the molecular weight and the peak area were calculated, and Mw was determined in a retention time range of 5 to 9.85 minutes as an analysis target.

(Acid Value)

About 1 g of a sample was precisely weighed out and put into an Erlenmeyer flask with a stopper and 100 mL of a cyclohexanone solvent was added thereto and dissolved. A phenolphthalein test solution as an indicator was added thereto and left for 30 seconds. Then, a 0.1 N alcoholic potassium hydroxide solution was gradually added dropwise until the solution turned light red. The acid value was determined according to the following formula.

Acid value (KOH mg/g)=(5.611×a×F)/S

In the formula, reference numerals indicate the following parameters.

S: Amount of sample collected (g),
a: Amount of 0.1 N alcoholic potassium hydroxide solution consumed (mL),
F: Titer of 0.1 N alcoholic potassium hydroxide solution.

[Synthesis Example 5] (Synthesis of Solution Containing Polyamide Resin (R-5))

70.78 parts of Pripol 1009 (acid value 194 KOH mg/g commercially available from Croda Japan) as a polybasic acid compound having 36 carbon atoms, 5.24 parts of 5-hydroxyisophthalic acid (5-HIPA) as a polybasic acid compound having a phenolic hydroxyl group, 82.84 parts of Priamine 1074 (acid value 210 KOH mg/g commercially available from Croda Japan) as a polyamine compound having 36 carbon atoms, and 4.74 parts of toluene were into a reaction container including a stirrer, a reflux cooling pipe with a moisture determination receiver, a nitrogen inlet pipe, and a thermometer. While stirring the mixture, the temperature was raised to 220° C. and a dehydration reaction continued while confirming outflow of water. Sampling was performed every hour, and after it was confirmed that Mw reached 40,000 and sufficient cooling was performed, 40 parts of cyclohexanone, 91.34 parts of toluene, and 96.12 parts of isopropyl alcohol were added as diluent solvents, and sufficiently dissolved. As described above, a solution containing a phenolic hydroxyl group-containing polyamide resin (R-5) having a solid content of 40.2% and an Mw of 40,000 was obtained.

[Synthesis Example 1] Synthesis of Solution Containing Polyurethane Polyurea Resin (R-1))

401.9 parts of a polyester polyol (polyol P-1011, number average molecular weight Mn=1,006, commercially available from Kuraray Co., Ltd.) obtained from terephthalic acid, adipic acid, and 3-methyl-1,5-pentanediol, 12.7 parts of dimethylolbutanoic acid, 151.0 parts of isophorone diisocyanate and 40 parts of toluene were put into a reaction container including a stirrer, a thermometer, a reflux condenser, a dropping device, and a nitrogen inlet pipe, and the mixture was reacted under a nitrogen atmosphere at 90° C. for 3 hours. 300 parts of toluene was added thereto and thereby a urethane prepolymer solution having an isocyanate group was obtained.

Next, 815.1 parts of the obtained urethane prepolymer solution having an isocyanate group was added to a solution in which 38.3 parts of isophoronediamine, 3.2 parts of di-n-butylamine, 342.0 parts of 2-propanol, and 396.0 parts of toluene were mixed, and reacted at 70° C. for 3 hours. After the reaction was completed, dilution was performed using a mixed solvent containing 144.0 parts of toluene and 72.0 parts of 2-propanol. As described above, a solution containing the thermosetting polyurethane polyurea resin (R-1) having a solid content of 30% and an Mw of 85,000 was obtained.

[Synthesis Example 2] Synthesis of Solution Containing Acrylic Resin (R-2))

20.0 parts of methyl methacrylate, 0.6 parts of methacrylic acid, 3.0 parts of methacrylic acid-2-hydroxyethyl, 76.4 parts of n-butyl methacrylate, and 500 parts of propylene glycol 1-monomethyl ether 2-acetate were put into a reaction container including a stirrer, a thermometer, a reflux condenser, a dropping device, and a nitrogen inlet pipe, and the mixture was heated to 100° C. under a nitrogen atmosphere with stirring. Then, 0.5 parts of azobisisobutyronitrile was added thereto and a polymerization reaction was caused for 2 hours. Then, 0.5 parts of azobisisobutyronitrile was added every hour until the conversion ratio became 98% or more, and a polymerization reaction was caused. After it was confirmed that the conversion ratio reached 98% or more, 250 parts of propylene glycol 1-monomethyl ether 2-acetate was added for dilution. As described above, a solution containing the thermosetting acrylic resin (R-2) having a solid content of 40% and an Mw of 30,000 was obtained.

[Synthesis Example 3] Synthesis of Solution Containing Polyamide Resin (R-3))

86.8 parts of Pripol 1009 (acid value 194 KOH mg/g, commercially available from Croda Japan) as a polybasic acid compound having 36 carbon atoms, 27.3 parts of 5-hydroxyisophthalic acid (hereinafter referred to as "5-HIPA" commercially available from Sugai Chemical Industry Co., Ltd.) as a polybasic acid compound having a phenolic hydroxyl group, 146.4 parts of Priamine 1074 (acid value 210 KOH mg/g, commercially available from Croda Japan) as a polyamine compound having 36 carbon atoms, and 100 parts of deionized water were put into a reaction container including a stirrer, a reflux cooling pipe, a nitrogen inlet pipe, an inlet pipe, and a thermometer, and the mixture was stirred until the heating temperature became constant. After the temperature had stabilized, the temperature was raised to 110° C. In addition, the temperature was raised to 120° C. 30 minutes after outflow of water was confirmed. Then, a dehydration reaction continued while the temperature was raised by 10° C. at 30 minute intervals. After the temperature reached 230° C., the temperature was maintained and the reaction continued for 3 hours. In addition, after the mixture was left under a vacuum of about 2 kPa for 1 hour, the temperature was lowered.

Finally, an antioxidant was added thereto, and when the temperature reached 100° C. or lower, dilution was performed using a mixed solvent containing toluene and 2-propanol (mass ratio of 1:1). As described above, a solution containing a phenolic hydroxyl group-containing polyamide resin (R-3) having a solid content of 40% and an Mw of 19,000 was obtained.

[Synthesis Example 4] Synthesis of Solution Containing Polyamide Resin (R-4))

66.1 parts of Pripol 1009 (acid value 194 KOH mg/g commercially available from Croda Japan) as a polybasic acid compound having 36 carbon atoms, 8.3 parts of 5-hydroxyisophthalic acid (5-HIPA) as a polybasic acid compound having a phenolic hydroxyl group, 81.1 parts of Priamine 1074 (acid value 210 KOH mg/g, commercially available from Croda Japan) as a polyamine compound having 36 carbon atoms, and 100 parts of deionized water were put into a reaction container including a stirrer, a reflux cooling pipe, a nitrogen inlet pipe, an inlet pipe, and a thermometer, and the mixture was stirred until the heating temperature became constant. The temperature was then raised to 110° C. In addition, the temperature was raised to 120° C. 30 minutes after outflow of water was confirmed. Then, a dehydration reaction continued while the temperature was raised by 10° C. at 30 minute intervals. After the temperature reached 230° C., the temperature was maintained and the reaction continued for 3 hours. In addition, after the mixture was left under a vacuum of about 2 kPa for 1 hour, the temperature was lowered.

Finally, an antioxidant was added thereto, and when the temperature reached 100° C. or lower, dilution was performed using a mixed solvent containing toluene and 2-propanol (mass ratio of 1:1). As described above, a solution containing a phenolic hydroxyl group-containing polyamide resin (R-4) having a solid content of 40% and an Mw of 75,000 was obtained.

[Synthesis Example 5] Solution Containing Polyamide Resin (R-5))

70.78 parts of Pripol 1009 (acid value 194 KOH mg/g commercially available from Croda Japan) as a polybasic acid compound having 36 carbon atoms, 5.24 parts of 5-hydroxyisophthalic acid (5-HIPA) as a polybasic acid compound having a phenolic hydroxyl group, 82.84 parts of Priamine 1074 (acid value 210 KOH mg/g commercially available from Croda Japan) as a polyamine compound having 36 carbon atoms, and 4.74 parts of toluene were into a reaction container including a stirrer, a reflux cooling pipe with a moisture determination receiver, a nitrogen inlet pipe, and a thermometer. While stirring the mixture, the temperature was raised to 220° C. and a dehydration reaction continued while confirming outflow of water. Sampling was performed every hour, and after it was confirmed that Mw reached 40,000 and sufficient cooling was performed, 40 parts of cyclohexanone, 91.34 parts of toluene, and 96.12 parts of isopropyl alcohol were added as diluent solvents, and sufficiently dissolved. As described above, a solution containing a phenolic hydroxyl group-containing polyamide resin (R-5) having a solid content of 40.2% and an Mw of 40,000 was obtained.

[Synthesis Example 6] Synthesis of Solution Containing Polyamide Resin (R-6))

69.4 parts of Pripol 1009 (acid value 194 KOH mg/g, commercially available from Croda Japan) as a polybasic acid compound having 36 carbon atoms, 5.46 parts of 5-hydroxyisophthalic acid (5-HIPA) as a polybasic acid compound having a phenolic hydroxyl group, 80.97 parts of Priamine 1074 (acid value 210 KOH mg/g, commercially available from Croda Japan) as a polyamine compound having 36 carbon atoms, and 4.74 parts of toluene were put into a 4-neck flask including a stirrer, a reflux cooling pipe with a moisture determination receiver, a nitrogen inlet pipe, and a thermometer. While stirring the mixture, the temperature was raised to 220° C. and a dehydration reaction continued while confirming outflow of water. Sampling was performed every hour, and after it was confirmed that Mw reached 40,000 and sufficient cooling was performed, 40 parts of cyclohexanone, 93.5 parts of toluene, and 97.5 parts of isopropyl alcohol were added as diluent solvents, and sufficiently dissolved. As described above, a solution containing a phenolic hydroxyl group-containing polyamide resin (R-6) having a solid content of 40.2% and an Mw of 70,000 was obtained.

[Thermally Conductive Insulating Fillers]

The thermally conductive insulating fillers used are as follows.

Thermally conductive spherical filler (F1-1): spherical alumina having an average circularity of 0.99 and an average particle diameter of 10 μm (Admafine AO-509, commercially available from Admatechs), boron nitride filler (F2-1): granulated boron nitride having an average compressive force of 1.32 mN required for a compression deformation ratio of 10% and an average particle diameter of 65 to 85 μm (Agglomerates100 commercially available from 3M).

[Other Materials]

(Curing Agent)

CA-1: A 50% toluene solution containing a bisphenol A type epoxy resin (Epikote 1001 commercially available from Japan Epoxy Resin Co., Ltd.).

(Mixed Solvent)

MS-1: A mixed solvent in which toluene and 2-propanol were mixed at a mass ratio of 1:1.

[Production Example 1-1] Production of Sheet 1A'

A mixed solution containing 11.5 parts of the solution containing the resin (R-1) obtained in Synthesis Example 1, 2.7 parts of the curing agent (CA-1), and 10.6 parts of the mixed solvent (MS-1) was prepared. 21 parts of the thermally conductive spherical filler (F1-1) and 4.2 parts of the boron nitride filler (F2-1) were added to the mixed solution and after stirring the dispersion, deaeration was performed in an ultrasonic stirrer for 2 minutes. The obtained coating solution was applied to a releasable sheet (release-treated polyethylene terephthalate film with a thickness of 75 μm) using a 6 MIL blade coater and dried at 100° C. for 2 minutes. As described above, an intermediate laminate 1A' in which one surface of the sheet 1A' with a theoretical film thickness of 34 μm derived from a coating amount per unit area and a theoretical density calculated according to the following method was covered with a releasable sheet was obtained. Here, the theoretical density of the sheet 1A' was 2.50.

Mass % of the thermally conductive spherical filler and mass % of the boron nitride filler contained in the sheet 1A' calculated from the composition were as follows.

Mass % of thermally conductive spherical filler=
(mass of thermally conductive spherical filler/
sum of dry masses of components of sheet
1A')×100

Mass % of boron nitride filler=(mass of boron
nitride filler/sum of dry masses of components
of sheet 1A')×100

The theoretical density of the sheet 1A' calculated from the composition

=(sum of dry masses of components of sheet 1A')/
(sum of dry volumes of components of sheet
1A')

=(dry mass of resin+dry mass of curing agent+mass
of thermally conductive spherical filler+mass of
boron nitride filler)/[(dry mass of resin/density
of resin)+(dry mass of curing agent/density of
curing agent)+(mass of thermally conductive
spherical filler/density of thermally conductive
spherical filler)+(mass of boron nitride filler/
density of boron nitride filler)]

General data can be used for the densities of the thermally conductive spherical filler, the boron nitride filler, and the like.

The densities of the binder resin and other organic components were roughly estimated as "1 (g/cm$^3$)."

[Production Example 1-2] Production of Sheet 2A'

An intermediate laminate 2A' in which one surface of a sheet 2A' with a theoretical film thickness of 34 μm was covered with a releasable sheet was obtained in the same manner as in Production Example 1-1 except that the composition of a mixed solution before adding fillers included 8.6 parts of the solution containing the resin (R-2) obtained in Synthesis Example 2, 2.7 parts of the curing agent (CA-1), and 13.5 parts of the mixed solvent (MS-1).

[Production Example 1-3] Production of Sheet 3A'

An intermediate laminate 3A' in which one surface of a sheet 3A' with a theoretical film thickness of 34 μm was covered with a releasable sheet was obtained in the same manner as in Production Example 1-1 except that the composition of a mixed solution before adding fillers included 8.6 parts of the solution containing the resin (R-3) obtained in Synthesis Example 3, 2.7 parts of the curing agent (CA-1), and 13.5 parts of the mixed solvent (MS-1).

[Production Example 1-4] Production of Sheet 4A'

An intermediate laminate 4A' in which one surface of a sheet 4A' with a theoretical film thickness of 34 μm was covered with a releasable sheet was obtained in the same manner as in Production Example 1-1 except that the composition of a mixed solution before adding fillers included 8.6 parts of the solution containing the resin (R-4) obtained in Synthesis Example 4, 2.7 parts of the curing agent (CA-1), and 13.5 parts of the mixed solvent (MS-1).

[Production Example 1-5] Production of Sheet 5A'

An intermediate laminate 5A' in which one surface of a sheet 5A' with a theoretical film thickness of 34 μm was covered with a releasable sheet was obtained in the same manner as in Production Example 1-1 except that the composition of a mixed solution before adding fillers included 8.6 parts of the solution containing the resin (R-5) obtained in the Synthesis Example 5, 2.7 parts of the curing agent (CA-1), and 13.5 parts of the mixed solvent (MS-1).

[Production Example 1-6] Production of Sheet 6A'

An intermediate laminate 6A' in which one surface of a sheet 6A' with a theoretical film thickness of 34 μm was covered with a releasable sheet was obtained in the same manner as in Production Example 1-1 except that the composition of a mixed solution before adding fillers included 8.6 parts of the solution containing the resin (R-6) obtained in Synthesis Example 6, 2.7 parts of the curing agent (CA-1), and 13.5 parts of the mixed solvent (MS-1).

[Production Example 1-7] Production of Sheet 7A'

An intermediate laminate 7A' in which one surface of a sheet 7A' with a theoretical film thickness of 34 μm was covered with a releasable sheet was obtained in the same manner as in Production Example 1-1 except that the composition of a mixed solution before adding fillers included 3.1 parts of an epoxy resin YL6121H (commercially available from Mitsubishi Chemical Corporation), 1.6 parts of a phenolic resin VH-4150 (commercially available from DIC), 0.1 parts of an imidazole compound 2PZ (commercially available from Shikoku Chemical Corporation), and 20 parts of cyclohexanone.

[Production Example 2-1] Production of Sheet 1B'

An intermediate laminate 1B' in which one surface of a sheet 1B' with a theoretical film thickness of 51 μm was covered with a releasable sheet was obtained in the same manner as in Production Example 1-1 except that the composition of a mixed solution before adding fillers included 10.8 parts of the solution containing the resin (R-1) obtained in Synthesis Example 1, 2.5 parts of the curing agent (CA-1), 18.7 parts of the mixed solvent (MS-1), 6.5 parts of the thermally conductive spherical filler (F1-1), and 11.5 parts of the boron nitride filler (F2-1). The theoretical density of the sheet 1B' obtained by performing calculation as in Sheet 1A' was 2.02.

[Production Example 2-2] Production of Sheet 2B'

An intermediate laminate 2B' in which one surface of a sheet 2B' with a theoretical film thickness of 51 μm was covered with a releasable sheet was obtained in the same manner as in Production Example 2-1 except that the composition of a mixed solution before adding fillers included 8.1 parts of the solution containing the resin (R-2) obtained in Synthesis Example 2, 2.5 parts of the curing agent (CA-1), and 21.4 parts of the mixed solvent (MS-1).

[Production Example 2-3] Production of Sheet 3B'

An intermediate laminate 3B' in which one surface of a sheet 3B' with a theoretical film thickness of 51 μm was covered with a releasable sheet was obtained in the same manner as in Production Example 2-1 except that the composition of a mixed solution before adding fillers included 8.1 parts of the solution containing the resin (R-3) obtained in Synthesis Example 3, 2.5 parts of the curing agent (CA-1), and 21.4 parts of the mixed solvent (MS-1).

[Production Example 2-4] Production of Sheet 4B'

An intermediate laminate 4B' in which one surface of a sheet 4B' with a theoretical film thickness of 51 μm was covered with a releasable sheet was obtained in the same manner as in Production Example 2-1 except that the composition of a mixed solution before adding fillers included 8.1 parts of the solution containing the resin (R-4) obtained in Synthesis Example 4, 2.5 parts of the curing agent (CA-1), and 21.4 parts of the mixed solvent (MS-1).

[Production Example 2-5] Production of Sheet 5B'

An intermediate laminate 5B' in which one surface of a sheet 5B' with a theoretical film thickness of 51 μm was covered with a releasable sheet was obtained in the same manner as in Production Example 2-1 except that the composition of a mixed solution before adding fillers included 8.1 parts of the solution containing the resin (R-5) obtained in Synthesis Example 5, 2.5 parts of the curing agent (CA-1), and 21.4 parts of the mixed solvent (MS-1).

[Production Example 2-6] Production of sheet 6B'

An intermediate laminate 6B' in which one surface of a sheet 6B' with a theoretical film thickness of 51 μm was covered with a releasable sheet was obtained in the same manner as in Production Example 2-1 except that the composition of a mixed solution before adding fillers included 8.1 parts of the solution containing the resin (R-6) obtained in Synthesis Example 6, 2.5 parts of the curing agent (CA-1), and 21.4 parts of the mixed solvent (MS-1).

[Production Example 2-7] Production of Sheet 7B'

An intermediate laminate 7B' in which one surface of a sheet 7B' with a theoretical film thickness of 51 μm was covered with a releasable sheet was obtained in the same manner as in Production Example 2-1 except that the composition of a mixed solution before adding fillers included 2.9 parts of an epoxy resin YL6121H (commercially available from Mitsubishi Chemical Corporation), 1.5 parts of a phenolic resin VH-4150 (commercially available from DIC), 0.1 parts of an imidazole compound 2PZ (commercially available from Shikoku Chemical Corporation), and 27.5 parts of cyclohexanone.

Example 1

Two laminates having a size of 10 cm×10 cm were cut out from the intermediate laminate 1A' obtained in Production Example 1-1. The mass of only the sheet 1A' excluding the releasable sheet was 0.852 g and 0.858 g in these two laminates. In addition, one laminate having a size of 10 cm×10 cm was cut out from the intermediate laminate 1B' obtained in Production Example 2-1. The mass of only the sheet 1B' excluding the releasable sheet was 1.042 g in the laminate.

The side opposite to the releasable sheet of one intermediate laminate 1A' and the side opposite to the releasable sheet of the intermediate laminate 1B' were combined and bonded together by a roll laminator.

Next, the releasable sheet on the side of the intermediate laminate 1B' was peeled off, similarly, the side opposite to the releasable sheet of the other intermediate laminate 1A' was bonded to the exposed surface of the sheet 1B', and thereby a laminate in which both surfaces of the thermally conductive insulating sheet (S-1) having a 3-layer structure were covered with a releasable sheet was obtained.

Here, as lamination conditions, a temperature of upper and lower rollers was 80° C., a laminating pressure was 0.6 MPa, and a speed was 0.5 m/min.

Example 2

A laminate in which both surfaces of the thermally conductive insulating sheet (S-2) having a 3-layer structure were covered with a releasable sheet was obtained in the same manner as in Example 1 except that the intermediate laminate 2A' obtained in Production Example 1-2 was used in place of the intermediate laminate 1A' and the intermediate laminate 2B' obtained in Production Example 2-2 was used in place of the intermediate laminate 1B'.

Example 3

A laminate in which both surfaces of the thermally conductive insulating sheet (S-3) having a 3-layer structure were covered with a releasable sheet was obtained in the same manner as in Example 1 except that the intermediate laminate 3A' obtained in Production Example 1-3 was used in place of the intermediate laminate 1A' and the intermediate laminate 3B' obtained in Production Example 2-3 was used in place of the intermediate laminate 1B'.

Example 4

A laminate in which both surfaces of the thermally conductive insulating sheet (S-4) having a 3-layer structure were covered with a releasable sheet was obtained in the same manner as in Example 1 except that the intermediate laminate 4A' obtained in Production Example 1-4 was used in place of the intermediate laminate 1A' and the intermediate laminate 4B' obtained in Production Example 2-4 was used in place of the intermediate laminate 1B'.

Example 5

A laminate in which both surfaces of the thermally conductive insulating sheet (S-5) having a 3-layer structure were covered with a releasable sheet was obtained in the same manner as in Example 1 except that the intermediate laminate 5A' obtained in Production Example 1-5 was used in place of the intermediate laminate 1A' and the intermediate laminate 5B' obtained in Production Example 2-5 was used in place of the intermediate laminate 1B'.

Example 6

A laminate in which both surfaces of the thermally conductive insulating sheet (S-6) having a 3-layer structure were covered with a releasable sheet was obtained in the same manner as in Example 1 except that the intermediate laminate 6A' obtained in Production Example 1-6 was used in place of the intermediate laminate 1A' and the intermediate laminate 6B' obtained in Production Example 2-6 was used in place of the intermediate laminate 1B'.

Comparative Example 1

A laminate in which both surfaces of the thermally conductive insulating sheet (S-7) having a 3-layer structure were covered with a releasable sheet was obtained in the same manner as in Example 1 except that the intermediate laminate 7A' obtained in Production Example 1-7 was used in place of the intermediate laminate 1A' and the intermediate laminate 7B' obtained in Production Example 2-7 was used in place of the intermediate laminate 1B'.

[Evaluation Items and Evaluation Methods for Thermally Conductive Insulating Sheets]

In respective examples of Examples 1 to 6 and Comparative Example 1, the releasable sheets on both surfaces were peeled off from the obtained laminate in which both surfaces of the thermally conductive insulating sheet having a 3-layer structure were covered with a releasable sheet, the thermally conductive insulating sheet having a 3-layer structure was obtained, and the following evaluations were performed.

(Complex Viscosity)

A complex viscosity of the thermally conductive insulating sheet was determined using a viscoelasticity measurement device (MCR Rheometer 302 commercially available from Anton Paar). Five thermally conductive insulating sheets were superimposed to form an evaluation sheet with a thickness of 0.65 mm. The evaluation sheet was interposed between a pair of 25 mmφ disc-like measuring tools and set in a measurement device, and a complex viscosity in a range of 100 to 200° C. was measured under conditions of a frequency of 10 Hz and a rate of temperature increase of 3.5° C./min, and the maximum value ($\alpha$) and the minimum value ($\beta$) of the complex viscosity in this temperature range were determined and $\alpha/\beta$ was determined.

(Flow Value)

A 50 mm-square thermally conductive insulating sheet was prepared and an initial mass W1 was measured. Then, the 50 mm-square thermally conductive insulating sheet was interposed between two 50 mm-square releasable sheets (release treatment polyethylene terephthalate film with a thickness of 75 μm), and heated and pressed under conditions of 1 MPa at 150° C. for 60 minutes. After heating and pressing, if there was no material protruding from the two releasable sheets, the heated and pressed product of the 50 mm-square thermally conductive insulating sheet interposed between the two releasable sheets was directly obtained. If there was any material protruding from the two releasable sheets, the protruding material was removed with a cutter, the size of the heated and pressed product of the thermally conductive insulating sheet was adjusted to 50 mm-square, and the 50 mm-square heated and pressed product interposed between the two releasable sheets was then obtained. A mass W2 of the obtained 50 mm-square heated and pressed product was measured, and the flow value was determined according to the following Formula (1).

$$\text{Flow value (\%)} = W2/W1 \times 100 \quad (1)$$

(Shear Adhesive Strength of Composite Member)

An aluminum substrate (a width of 25 mm, a length of 100 mm, a thickness of 2 mm, a coefficient of linear expansion of 23 ppm/° C., corresponding to a heat dissipation base substrate), a thermally conductive insulating sheet, and a copper substrate (a width of 25 mm, a length of 100 mm, a thickness of 2 mm, a coefficient of linear expansion of 16 ppm/° C., corresponding to a member in contact with the thermally conductive insulating adhesive film of the heat generating member) were superimposed, and heated and pressed (thermally pressed) under conditions of 3 MPa at 150° C. for 60 minutes, and thereby a composite member test piece was obtained. The size of the part of the thermally conductive insulating adhesive sheet interposed between upper and lower members was 25 mm in width and 40 mm in length.

The shear adhesive strength was measured according to JIS K 6850.

A shear force of the composite member test piece was measured using SHIMADZU/Autogragh AGS-X (commercially available from Shimadzu Corporation) under conditions of a tensile speed of 1 mm/min at 25° C. The measurement was performed twice and an average value thereof was defined as a shear adhesive strength.

(Porosity of Thermally Conductive Insulating Film)

The porosity of the thermally conductive insulating sheet can be calculated using the following formula.

Porosity=1−(measured density of thermally conductive insulating sheet/theoretical density of thermally conductive insulating sheet)

Measured density of thermally conductive insulating sheet=mass (g) of thermally conductive insulating sheet/volume (cm³) of thermally conductive insulating sheet Theoretical density of thermally conductive insulating sheet=sum (g) of masses of two sheets (A') and one sheet (B')/sum (cm³) of volumes of two sheets (A') and one sheet (B')

Volume of sheet (A') or sheet (B')=mass (g) of sheet (A') or sheet (B')/density (g/cm³) of sheet (A') or sheet (B')

General data can be used for the densities of the thermally conductive spherical filler, the boron nitride filler, and the like.

The densities of the binder resin and other organic component were roughly estimated as "1 (g/cm$^3$)."

For the thermally conductive insulating film obtained by heating and pressing (thermally pressing) the thermally conductive insulating sheet under conditions of 1 MPa at 150° C. for 60 minutes, in the same manner as above, the porosity was theoretically determined from the formula: porosity=1−(measured density/theoretical density).

[Evaluation Results]

Table 1 shows main production conditions and evaluation results.

In all of Examples 1 to 6, in the composition of the thermally conductive insulating sheet, when the type of the binder resin, the molecular weight of the binder resin, the proportion of the curing agent, the type and amount of the thermally conductive insulating filler, and the like were adjusted, it was possible to produce a thermally conductive insulating sheet in which a complex viscosity in a temperature range of 100 to 200° C. was 10,000 to 150,000 Pa·s and a ratio ($\alpha/\beta$) of the maximum value ($\alpha$) to the minimum value ($\beta$) of the complex viscosity in this temperature range was 1.0 to 4.0.

In Examples 1 to 6, when the thermosetting polyurethane resin, thermosetting acrylic resin, or thermosetting polyimide resin having an appropriate molecular weight was used as the binder resin, it was possible to produce a thermally conductive insulating sheet having the above characteristics.

In Examples 1 to 6, a laminate of two sheets (A') and one sheet (B') had appropriate fluidity during lamination in producing of the thermally conductive insulating sheet, and thereby it was possible to reduce the number of voids and reduce the porosity.

Since all of the thermally conductive insulating sheets obtained in Examples 1 to 6 had the above complex viscosity characteristics and had appropriate fluidity during heating and pressing, there was no material leaking to the outside beyond the original size of the thermally conductive insulating sheet during heating and pressing, and the flow value was suitable at 90 to 100%.

Since the thermally conductive insulating sheets obtained in Examples 1 to 6 had high flexibility before heating and pressing and after heating and pressing and had appropriate fluidity during heating and pressing, they could favorably adhere the aluminum substrate to the copper substrate, and it was possible to further reduce the porosity by heating and pressing. In all of composite member test pieces using the thermally conductive insulating sheets obtained in Examples 1 to 6, the shear adhesive strength was 2.5 MPa or more and the porosity of the thermally conductive insulating film was 0.2 or less.

It was found that it was possible to produce a composite member having excellent adhesion between the heat generating member and the heat dissipation member, having a low porosity of the thermally conductive insulating film, and favorable performance using the thermally conductive insulating sheets obtained in Examples 1 to 6.

In Comparative Example 1, a thermally conductive insulating adhesive sheet was produced using the thermosetting epoxy resin and the thermosetting phenolic resin as binder resins. In the thermally conductive insulating sheet, the maximum value ($\alpha$) of the complex viscosity in a temperature range of 100 to 200° C. exceeded 150,000 Pa·s, and a ratio ($\alpha/\beta$) of the maximum value ($\alpha$) to the minimum value ($\beta$) of the complex viscosity exceeded 4.

Because the thermally conductive insulating sheet obtained in Comparative Example 1 had a smaller minimum value ($\beta$) of the complex viscosity than those of Examples 1 to 6, the fluidity during heating and pressing was high, there was a large amount of a material leaked to the outside beyond the original size of the thermally conductive insulating sheet during heating and pressing, and the flow value was less than 90%.

The thermally conductive insulating sheet obtained in Comparative Example 1 had a larger maximum value ($\alpha$) of the complex viscosity than those in Examples 1 to 6 because a curing reaction proceeded with crosslinking by heating. Therefore, the flexibility after curing was significantly low, and it was not possible to favorably adhere the aluminum substrate to the copper substrate.

In the thermally conductive insulating sheet obtained in Comparative Example 1, $\alpha/\beta$ was large and a sharp increase in viscosity occurred during heating and pressing. In the thermally conductive insulating sheet obtained in Comparative Example 1, since the binder resin became highly viscous before filling voids, it was not possible to effectively reduce the porosity by heating and pressing.

In the composite member test piece using the thermally conductive insulating sheet obtained in Comparative Example 1, the shear adhesive strength was less than 1.5 MPa, and the porosity of the thermally conductive insulating film exceeded 0.3.

TABLE 1

| | Number of laminations | Resin | Mw of resin | Maximum value of complex viscosity ($\alpha$) | Minimum value of complex viscosity ($\beta$) | $\alpha/\beta$ | Flow value (%) | Porosity after thermally pressing (—) | Shear adhesive strength of composite member (MPa) |
|---|---|---|---|---|---|---|---|---|---|
| Example 1 | 3 | Polyurethane | 85,000 | 63,000 | 38,200 | 1.65 | 97.2 | 0.156 | 3.5 |
| Example 2 | 3 | Acrylic resin | 30,000 | 45,600 | 28,300 | 1.61 | 98.1 | 0.161 | 4.0 |
| Example 3 | 3 | Polyamide | 19,000 | 63,000 | 24,000 | 2.63 | 91.5 | 0.191 | 2.5 |
| Example 4 | 3 | Polyamide | 75,000 | 110,000 | 50,500 | 2.18 | 94.2 | 0.185 | 2.5 |
| Example 5 | 3 | Polyamide | 40,000 | 69,500 | 34,900 | 1.99 | 97.5 | 0.148 | 4.0 |
| Example 6 | 3 | Polyamide | 70,000 | 90,500 | 45,000 | 2.01 | 98.3 | 0.155 | 4.0 |
| Comparative Example 1 | 3 | Epoxy resin/ phenolic resin | | 163,000 | 12,000 | 13.58 | 88.5 | 0.315 | 1.4 |

The present invention is not limited to the above embodiments and examples, and appropriate design modifications without departing from the scope and spirit of the present invention can be made.

Priority is claimed on Japanese Patent Application No. 2017-178236, filed Sep. 15, 2017, the content of which is incorporated herein by reference.

REFERENCE SIGNS LIST 1, 2, 3, 4, 5 Composite member
10 Heat generating member
20 Thermally conductive insulating adhesive film
30 Heat dissipation base substrate
50, 60 Power semiconductor module (heat generating member)
51, 61, 65 Substrate
52, 62, 64 Solder layer
53, 63 Power semiconductor element (heat generating part)
54, 66 Sealing material

The invention claimed is:

1. A thermally conductive insulating sheet which includes an uncured and/or semi-cured binder resin (R) material which is a thermosetting resin, and the thermally conductive insulating sheet comprises a plurality of layers (A) and one or more layers (B), wherein a complex viscosity of the thermally conductive insulating sheet in a temperature range of 100° C. to 200° C. is 10,000 Pa·s to 150,000 Pa·s, a ratio ($\alpha/\beta$) of a maximum value ($\alpha$) to a minimum value ($\beta$) of the complex viscosity of the thermally conductive insulating sheet in this temperature range is 1.0 to 4.0, and a flow value of the thermally conductive insulating sheet defined by the following Formula (1) is 90% to 100%:

$$\text{Flow value (\%)} = W2/W1 \times 100 \quad (1)$$

in Formula (1), reference numerals indicate the following parameters

W1 is a mass of a 50 mm-square thermally conductive insulating sheet, and

W2 is a mass of a 50 mm-square heated and pressed product of a thermally conductive insulating sheet obtained by heating and pressurizing the 50 mm-square thermally conductive insulating sheet under conditions of 150° C. and 1 MPa for 60 minutes, wherein the thermally conductive insulating sheet further includes a thermally conductive insulating filler (F) comprising a thermally conductive spherical filler (F1) excluding boron nitride and a boron nitride filler (F2), the boron nitride filler (F2) is an aggregate of boron nitride having an average compressive force of 5 mN or less required for a compression deformation ratio of 10%, in each of the plurality of layers (A), an amount of the thermally conductive spherical filler (F1) is larger than an amount of the boron nitride filler (F2), in each of the one or more layers (B), an amount of the boron nitride filler (F2) is larger than an amount of the thermally conductive spherical filler (F1), and the plurality of layers (A) and the one or more layers (B) are alternately laminated and the layer (B) does not become the outermost layer.

2. The thermally conductive insulating sheet according to claim 1, wherein the complex viscosity of the thermally conductive insulating sheet in this temperature range of 100° C. to 200° C. is 27,000 Pa·s to 100,000 Pa·s, the ratio ($\alpha/\beta$) of the maximum value ($\alpha$) to the minimum value ($\beta$) of the complex viscosity of the thermally conductive insulating sheet in this temperature range is 1.0 to 2.5, and the flow value of the thermally conductive insulating sheet is 95% to 100%.

3. The thermally conductive insulating sheet according to claim 2, wherein the binder resin (R) is at least one selected from among a thermosetting polyurethane resin, a thermosetting acrylic resin, and a thermosetting polyamide resin.

4. A composite member in which a heat dissipation base substrate is adhered to at least one surface of a heat generating member including a heat generating part that is able to generate heat via a thermally conductive insulating film comprising a cured material of a binder resin (R), which is formed of a heated and pressed product of the thermally conductive insulating sheet according to claim 2.

5. The composite member according to claim 4,
wherein the thermally conductive insulating film has a porosity of 0.3 or less.

6. The composite member according to claim 4,
wherein the heat generating member includes a power semiconductor element.

7. The thermally conductive insulating sheet according to claim 1,
wherein the binder resin (R) is at least one selected from among a thermosetting polyurethane resin, a thermosetting acrylic resin, and a thermosetting polyamide resin.

8. A composite member in which a heat dissipation base substrate is adhered to at least one surface of a heat generating member including a heat generating part that is able to generate heat via a thermally conductive insulating film comprising a cured material of a binder resin (R), which is formed of a heated and pressed product of the thermally conductive insulating sheet according to claim 1.

9. The composite member according to claim 8,
wherein the thermally conductive insulating film has a porosity of 0.3 or less.

10. The composite member according to claim 8,
wherein the heat generating member includes a power semiconductor element.

* * * * *